United States Patent
Adkisson et al.

(10) Patent No.: US 7,563,636 B2
(45) Date of Patent: Jul. 21, 2009

(54) METHOD OF FORMING A PIXEL SENSOR CELL FOR COLLECTING ELECTRONS AND HOLES

(75) Inventors: James W. Adkisson, Jericho, VT (US); Andres Bryant, Burlington, VT (US); John J. Ellis-Monaghan, Grand Isle, VT (US); Mark D. Jaffe, Shelburne, VT (US); Jeffrey B. Johnson, Essex Junction, VT (US); Alain Loiseau, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/172,304

(22) Filed: Jul. 14, 2008

(65) Prior Publication Data

US 2008/0274578 A1 Nov. 6, 2008

Related U.S. Application Data

(62) Division of application No. 11/161,535, filed on Aug. 8, 2005, now Pat. No. 7,439,561.

(51) Int. Cl.
*H01L 21/00* (2006.01)
(52) U.S. Cl. .................... 438/57; 257/233; 257/292; 257/E27.131; 257/E27.132; 257/E31.038
(58) Field of Classification Search ............. 257/233, 257/292, E27.131, E27.132, E31.038; 438/57, 438/90
See application file for complete search history.

(56) References Cited

U.S. PATENT DOCUMENTS

| 4,598,305 | A | 7/1986 | Chiang et al. |
| 5,608,243 | A | 3/1997 | Chi et al. |
| 5,874,993 | A | 2/1999 | Ciccarelli et al. |
| 5,973,735 | A | 10/1999 | Stekelenburg et al. |
| 6,194,702 | B1 | 2/2001 | Hook et al. |
| 7,115,855 | B2 | 10/2006 | Hong |
| 2002/0024071 | A1 | 2/2002 | Kawajiri et al. |
| 2006/0226456 | A1* | 10/2006 | Adkisson et al. ............ 257/291 |

OTHER PUBLICATIONS

Office Action: U.S. Appl. No. 12/172,306, Title: "Pixel Sensor Cell for Collecting Electrons and Holes", Filing Date:: Jul. 14, 2008, Date Mailed: Mar. 11, 2009.

* cited by examiner

*Primary Examiner*—Kiesha L Rose
*Assistant Examiner*—Daniel Shook
(74) *Attorney, Agent, or Firm*—Anthony J. Canale

(57) ABSTRACT

The present invention is a pixel sensor cell and method of making the same. The pixel sensor cell approximately doubles the available signal for a given quanta of light. The device of the present invention utilizes the holes produced by impinging photons in a pixel sensor cell circuit. A pixel sensor cell having reduced complexity includes an n-type collection well region formed beneath a surface of a substrate for collecting electrons generated by electromagnetic radiation impinging on the pixel sensor cell and a p-type collection well region formed beneath the surface of the substrate for collecting holes generated by the impinging photons. A circuit structure having a first input is coupled to the n-type collection well region and a second input is coupled to the p-type collection well region, wherein an output signal of the pixel sensor cell is the magnitude of the difference of a signal of the first input and a signal of the second input.

13 Claims, 9 Drawing Sheets

METHOD OF FORMING A PIXEL SENSOR CELL FOR COLLECTING ELECTRONS AND HOLES

This application is a divisional of U.S. patent application Ser. No. 11/161,535, filed on Aug. 8,2005, now U.S. Pat. No. 7,439,561.

BACKGROUND OF THE INVENTION

1. Field of the Invention

The present invention relates to pixel sensors and in particular a pixel sensor which approximately doubles the available signal for a given quanta of light.

2. Description of Related Art

CMOS image sensors are beginning to replace conventional CCD sensors for applications requiring image pick-up such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption can be restrained lower than that of CCD sensors, and further, CMOS logic circuits and like logic processing devices are easily integrated in the sensor chip and therefore the CMOS image sensors can be miniaturized.

Current CMOS image sensors comprise an array of pixel sensor cells, which are used to collect light energy and convert it into readable electrical signals. Each pixel sensor cell comprises a photosensitive element, such as a photodiode, photo gate, or photoconductor overlying a doped region of a substrate for accumulating photo-generated charge in an underlying portion thereof. A read-out circuit is connected to each pixel cell and often includes a diffusion region for receiving charge from the photosensitive element, when read-out. Typically, this is accomplished by a transistor device having a gate electrically connected to the floating diffusion region. The imager may also include a transistor, having a transfer gate, for transferring charge from the photosensitive element to the floating diffusion region, and a transistor for resetting the floating diffusion region to a predetermined charge level prior to charge transfer.

As shown in FIG. 1, a typical CMOS pixel sensor cell 10 includes a pinned photodiode 20 having a pinning layer 18 doped p-type and an underlying collection well 17 lightly doped n-type. P-type pinning layer 18 is electrically coupled to p-type substrate 15 by a doped p-type region 29. Typically, pinned photodiode 20 is formed on top of a p-type silicon substrate 15, or a p-type epitaxial silicon layer or p-well surface layer, having a lower p-type concentration than pinning layer 18. N region 17 and p region 18 of photodiode 20 are typically spaced between an isolation region 19 (i.e. shallow trench isolation (STI)) and a charge transfer transistor gate 25 which is surrounded by thin spacer structures 23a,b. The photodiode 20 thus has two p-type regions 18 and 15 having a same potential so that the n region 17 is fully depleted at a pinning voltage (Vp). The pinned photodiode 20 is termed "pinned" because the potential in the photodiode 20 is pinned to a constant value, Vp, when the photodiode 20 is fully depleted.

In operation, electromagnetic radiation 35 (i.e. visible light) impinging the pixel is focused down onto the photodiode 20 creating electron-hole pairs 40. Electrons collect at the n type region 17. When the transfer gate structure 25 is operated, i.e., turned on, the photo-generated charge 24 is transferred from the charge accumulating lightly doped n-type region 17 via a transfer device surface channel 16 to a floating diffusion region 30 which is doped n+type. Charge on diffusion region 30 is eventually transferred to circuit structure 45 (i.e. source-follower gate) for amplification. In the conventional pixel sensor cell 10, holes equal in number to the electrons are generated by the impinging electromagnetic radiation 35 and are collected in the substrate 15. Since the substrate 15 is usually grounded, the holes exit the pixel sensor cell 10 through the ground line 50. Thus, only about half of the generated carriers (i.e. electrons) are collected to contribute to the output signal of the conventional pixel sensor cell.

In commonly assigned U.S. Pat. No. 6,194,702 filed on Aug. 25, 1997 to Hook et al. (hereinafter referred to as "Hook"), two complementary circuits (i.e. PFET and NFET circuits) are created for use with the photodiode with each circuit: capturing electrons and holes, respectively. Portions of the electron and hole collection wells are used as source/drain regions for the respective NFET and PFET devices. The formation of active devices such as the NFET and PFET transistors in the photodiode reduces the area available to collect impinging electromagnetic radiation. Also, the process complexity is increased since additional films must be deposited and etched to form the NFET and PFET. Exposure of the upper substrate surface of the photodiode to the additional fabrication steps increases defects at the substrate surface of the photodiode which can have adverse effects on the pixel sensor cell of Hook such as an increase in dark current.

Bearing in mind the problems and deficiencies of the prior art, what is required is a pixel sensor cell having reduced complexity for collecting both electrons and holes.

SUMMARY OF THE INVENTION

It is an aspect of the present invention to provide a pixel sensor cell having reduced complexity for collecting both electrons and holes.

It is another aspect of the present invention to provide a pixel sensor cell with improved signal-to-noise ratio.

It is another aspect of the present invention to provide a pixel sensor cell with a reduced size collection area.

A further aspect of the invention is to provide a pixel sensor cell which approximately doubles the output current relative to conventional pixel sensor cells.

It is yet another aspect of the present invention to provide a pixel sensor cell which virtually eliminates substrate current.

Still other aspects and advantages of the invention will in part be obvious and will in part be apparent from the specification.

The above and other objects and advantages, which will be apparent to one of skill in the art, are achieved in the present invention which is directed to, in a first aspect, a pixel sensor cell and method thereof comprising an n-type collection well region formed beneath a surface of a substrate for collecting electrons generated by electromagnetic radiation impinging on the pixel sensor cell and a p-type collection well region formed beneath the surface of the substrate for collecting holes generated by the impinging electromagnetic radiation. A circuit structure having a first input is coupled to the n-type collection well region and a second input is coupled to the p-type collection well region, wherein an output signal of the pixel sensor cell is the magnitude of the difference of a signal of the first input and a signal of the second input.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
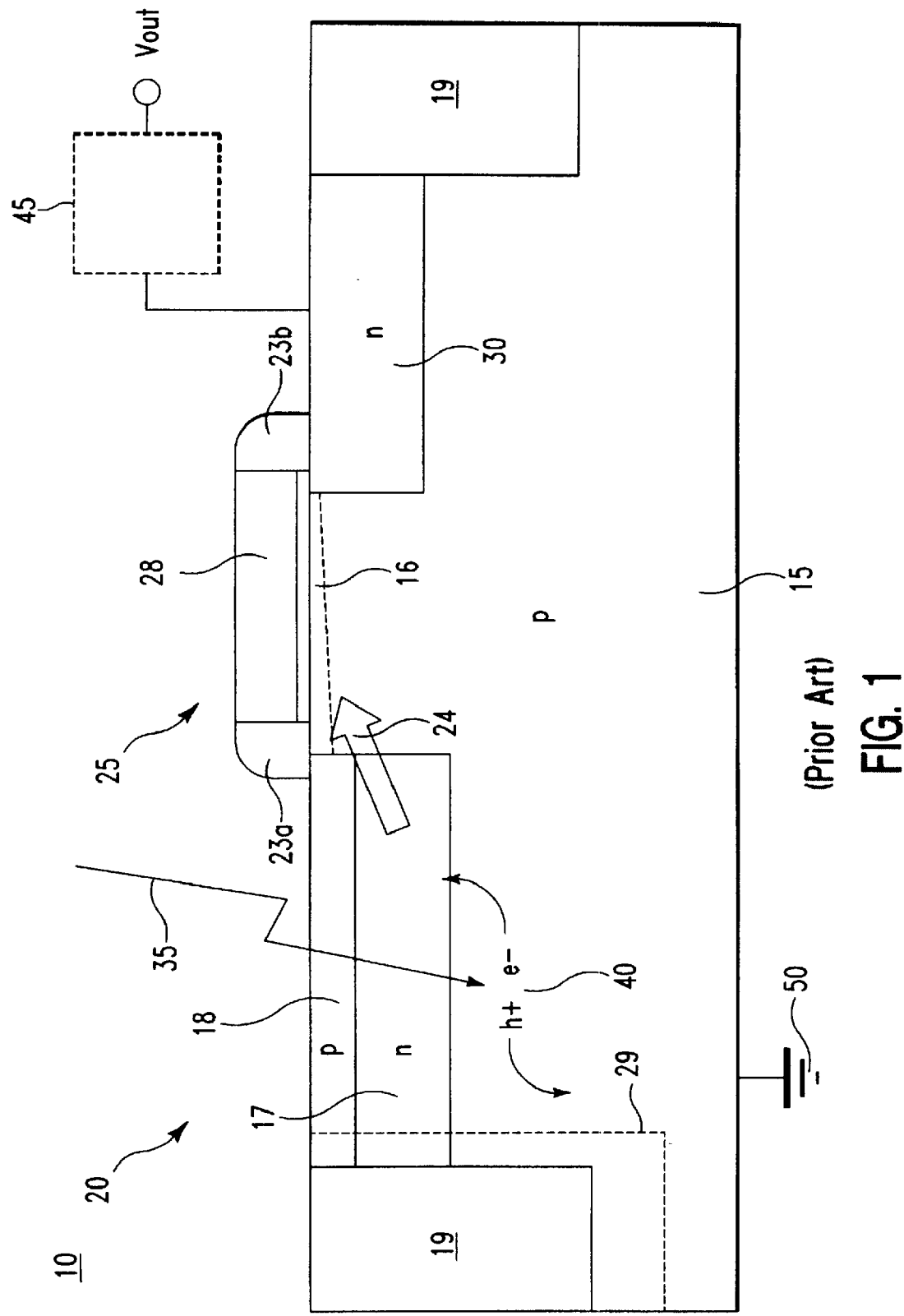
FIG. 1 is a cross-sectional view of a prior art pixel sensor cell.

In describing embodiments of the present invention, reference will be made herein to FIGS. 1-6 of the drawings in which like numerals refer to like features of the invention. Features of the invention are not necessarily shown to scale in the drawings.

Embodiments of the invention are described herein below in terms of a "pixel sensor cell". It is noted that the term "pixel sensor cell" is used to generally refer to any type of sensor cell which is capable of converting incident electromagnetic radiation into an electrical signal. An example of a pixel sensor cell according to the invention includes a pixel sensor cell that is capable of detecting optical wavelengths of electromagnetic radiation and is commonly referred to as an "image sensor". An image sensor fabricated using CMOS technology is commonly referred to as a "CMOS image sensor".

Figure 2:
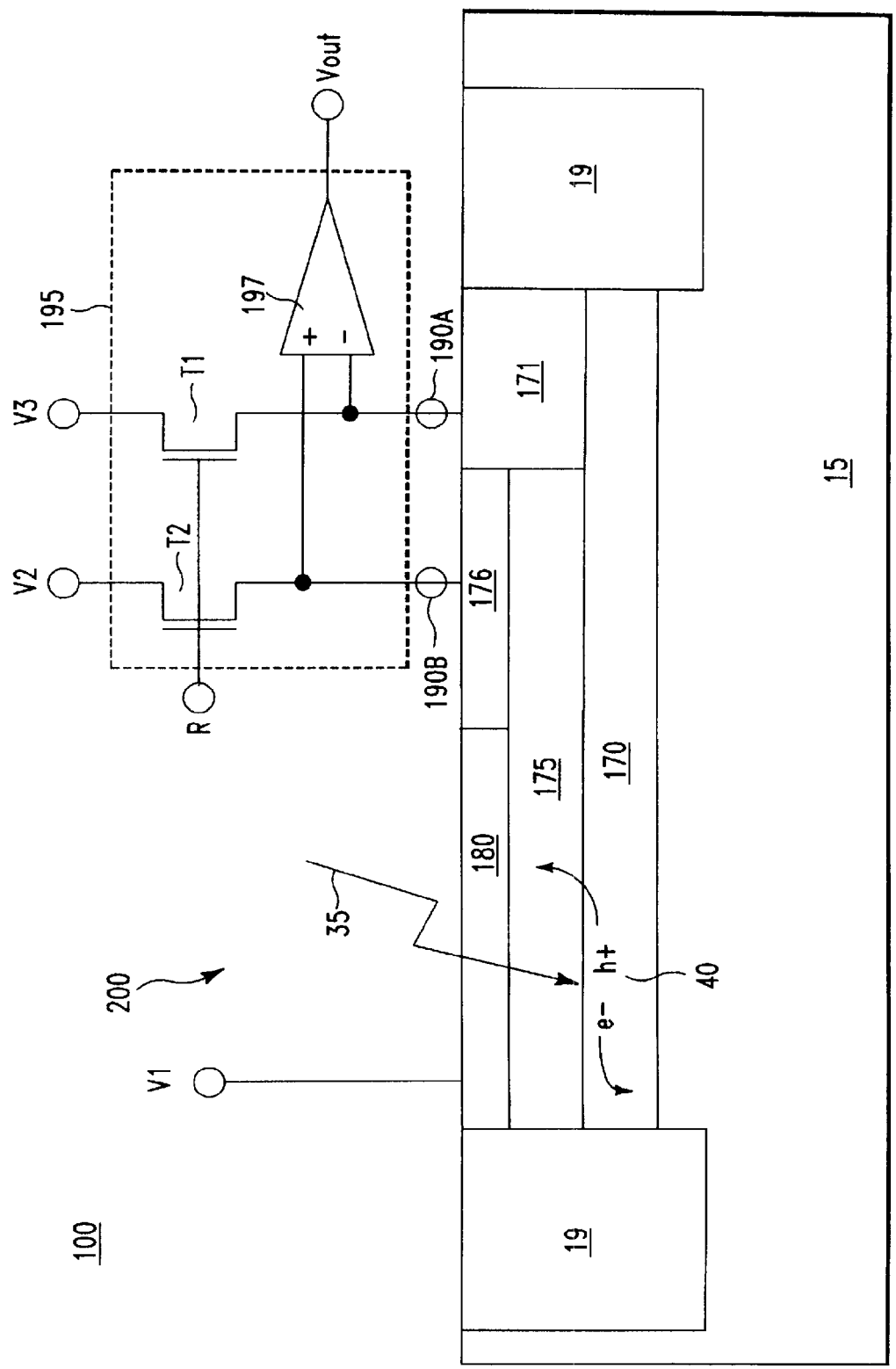
FIG. 2 is a cross-sectional view of an embodiment of the pixel sensor cell according to the present invention.

FIG. 2 illustrates a schematic cross-section of an embodiment of the pixel sensor cell 100 of the present invention. As shown in FIG. 2, a photosensitive device or photodiode 200 is formed in a substrate 15 of a first conductivity type, e.g. p type, between isolation regions 19 (e.g. STI). The photodiode 200 comprises a surface pinning layer 180 doped with material of a second conductivity type, e.g., n type material dopant, a first charge collection well region 175 doped with material of a first conductivity, e.g., p type material dopant, formed directly underneath the pinning layer 180, and a second charge collection well region 170 doped with material of a second conductivity, e.g. n type material dopant, formed directly underneath the first charge collection well region 175. The pinning layer 180 is schematically shown electrically coupled to voltage source V1, e.g. Vdd for n type pinning layer 180 (ground for a p type pinning layer 180). The pinning layer 180 can be contacted by, for example, an interconnect (i.e. wire) which provides an electrical path to the voltage source V1. Optionally, the pinning layer 180 can be omitted. A first contact region 171 doped with material of a second conductivity type, e.g. n type dopant material, and an interconnect such as a copper (Cu) or aluminum wire (shown schematically) in contact with the first contact region 171 electrically connect the n collection well region 170 to an input 190A of circuit structure 195. A second contact region 176 doped with material of a First conductivity type, e.g. p type dopant material, and an interconnect such as a copper (Cu) or aluminum wire (shown schematically) in contact with the second contact region 176 electrically connect the p collection well region 175 to an input 190B of circuit structure 195.

The photodiode 200 collects impinging electromagnetic radiation 35 (i.e. photons) which creates electron-hole pairs 40. The n collection well region 170 and the p collection well region 175 are initialized to a positive and a negative potential respectively, and are typically depleted. The electrons are collected in the n collection well region 170 and flow to input 190A through the n contact region 171. The holes are collected in the p collection well region 175 and flow to input 190B through the p contact region 176. A function of circuit structure 195 is to amplify a resultant signal created by the electrons and holes. As such, circuit structure 195 comprises a differential amplifier circuit 197 having inputs coupled to inputs 190A, 190B. Additionally, circuit structure 195 comprises a reset signal R coupled to switches T1 and T2 (i.e. field effect transistors) for resetting the pixel sensor cell 100. For the polarities of the collection well regions 170, 175 described hereinabove, T1 is an NFET and V3=Vdd, and T2 is a PFET and V2 ground (i.e. 0V). Since the signal created by the flow of electrons is a complement of the signal created by the flow of holes, an output signal Vout of the pixel sensor cell 100 will be approximately double that of conventional pixel sensor cells using similarly sized photodiode regions (i.e. sensor 10 shown in FIG. 1). The pixel sensor cell 100 utilizes the holes that are generated by impinging electromagnetic radiation 35 rather than allowing the holes to collect in the substrate 15 and exit through a ground connection as is done in conventional pixel sensor cells.

The additional signal from the holes will provide several advantages: 1) the additional signal may be used to improve the signal-to-noise ratio for a given collection area of the photodiode 200; and 2) the additional signal may be used to reduce the collection area of the photodiode 200 by approximately 50% in order to reduce the size of the pixel sensor cell 100. Since both the electrons and the holes can be collected and utilized in the circuit structure 195, the size of the collection area of the pixel sensor cell 100 can be reduced by approximately 50% of the size of the collection area of the conventional pixel sensor cell 10 while producing output of similar magnitude to the conventional pixel sensor cell 10.

Figure 3A:
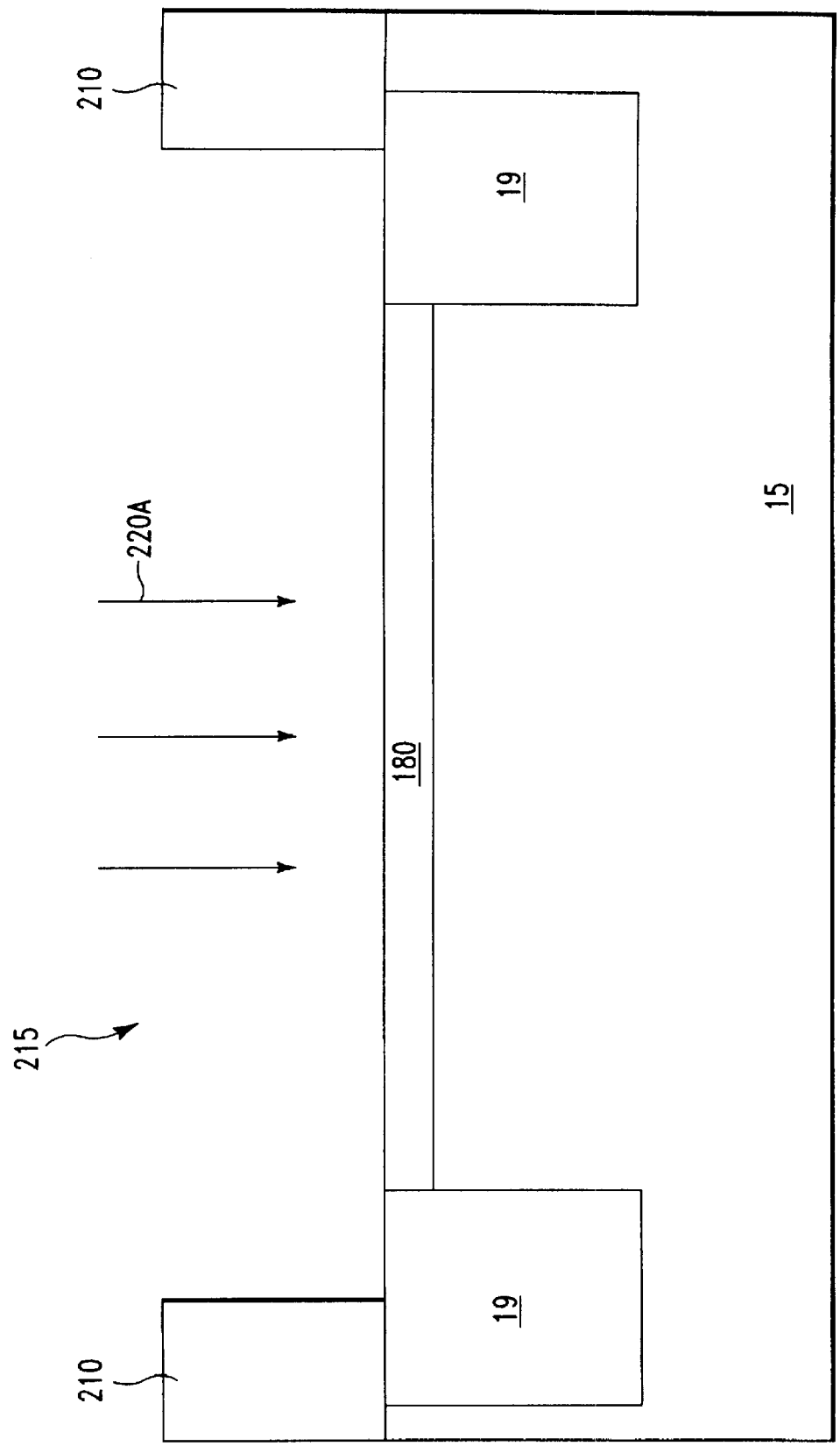
FIGS. 3A-D illustrate exemplary steps for producing the pixel sensor cell of the present invention.

A method to fabricate a pixel sensor cell according to an embodiment of the invention will be described with reference to FIGS. 3A-D. As shown in FIG. 3A, there is provided a substrate 15 which may be a bulk semiconductor including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description of this embodiment of the invention, substrate 15 is a Si-containing semiconductor substrate of a first conductivity type, e.g., lightly doped with p-type dopant material such as boron or indium (beryllium or magnesium for a III-V semiconductor), to a standard concentration ranging between about $1\times10^{14}$ atoms per cm$^3$ to about $1\times10^{16}$ atoms per cm$^3$. The light doping is advantageous for large depletion regions and good light collection. Isolation regions 19 are formed in the p-substrate 15 by conventional methods known in the art.

Still referring to FIG. 3A, a masking layer such as photoresist is formed atop substrate 15 and is patterned to form ion implantation mask 210 according to techniques known in the art to provide an opening 215 between isolation regions 19 where the charge accumulation region of the photodiode 200 is to be formed. The opening 215 permits the implantation of ions 220A of an n type dopant material to form the pinning layer 180. An example of the n type dopant material is phosphorous, arsenic or antimony. Phosphorous can be ion implanted at a concentration sufficient to form the n type pinning layer 180. For example, phosphorous can be ion implanted at a substantially vertical angle in relation to the surface of the substrate 15 at conditions of a dose from about $5\times10^{12}$ atoms per cm$^2$ to about $5\times10^{13}$ atoms per cm$^2$ and an ion implant energy from about 5 keV to about 30 keV resulting in a phosphorous concentration in a silicon substrate of about $1\times10^{18}$ atoms per cm$^3$ to about $1\times10^{19}$ atoms per cm$^3$.

Figure 3B:
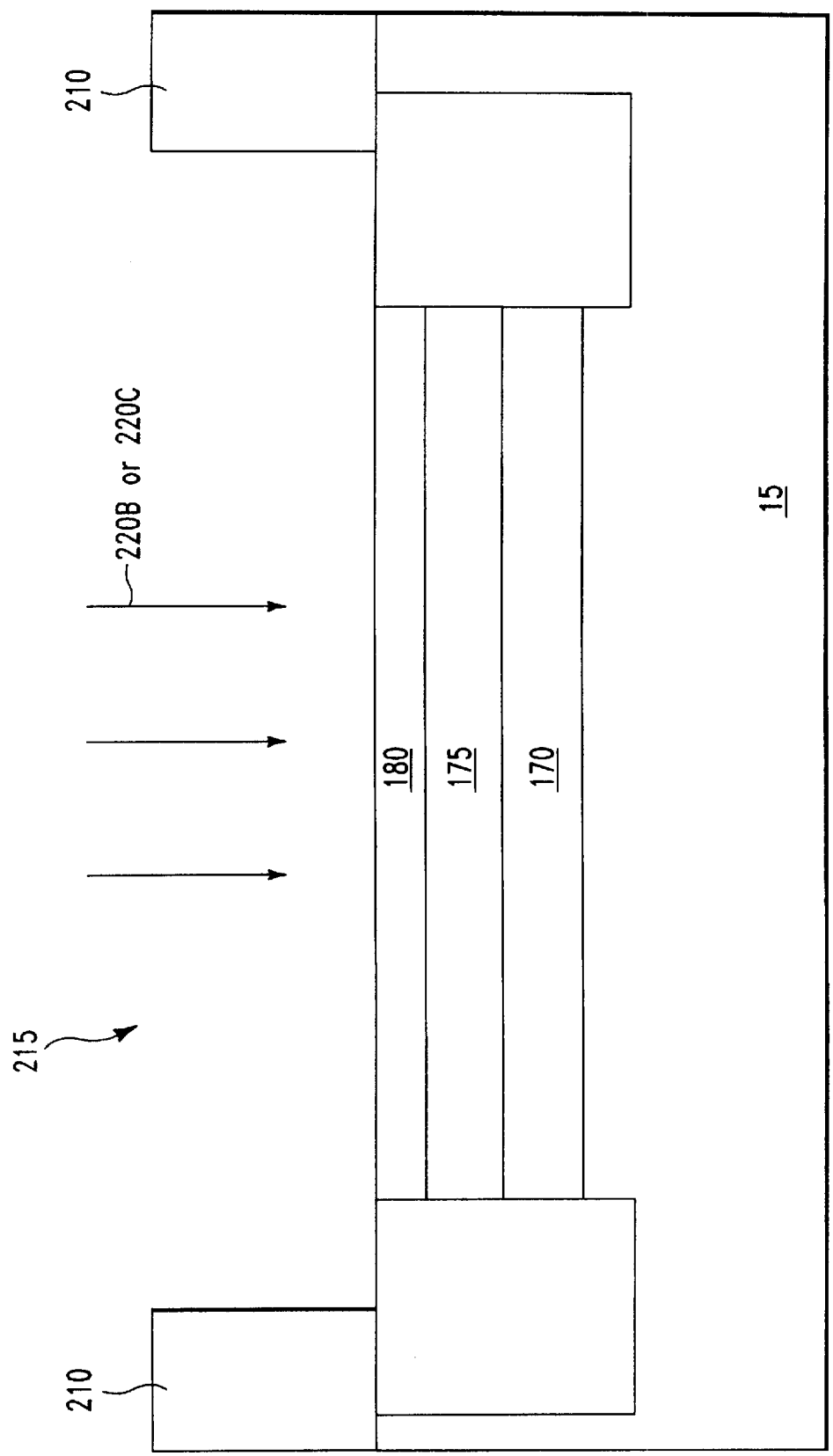

Referring to FIG. 3B, using the same ion implantation mask 210 (or, optionally, a different ion implantation mask), the opening 215 permits the implantation of ions 220B of a p type dopant material to form the charge collection well region 175 beneath the n type pinning layer 180. The p type dopant material can be ion implanted at higher energy levels to form the p type collection well region 175 of the photodiode 200 as shown in the FIGs. An example of the p-type dopant material is boron. Boron can be ion implanted at a (concentration sufficient to form the p type collection well region 175. For example, boron can be ion implanted at a substantially vertical angle in relation to the surface of the substrate 15 at conditions of a dose from about $2\times10^{12}$ atoms per cm$^2$ to about $2\times10^{13}$ atoms per cm$^2$ and an ion implant energy from about 50 keV to about 150 keV resulting in a boron concentration in a silicon substrate of about $5\times10^{16}$ atoms per cm$^3$ to about $5\times10^{17}$ atoms per cm$^3$.

Still referring to FIG. 3B, using the same ion implantation mask 210 (or, optionally, a different ion implantation mask), the opening 215 permits the implantation of ions 220C of an n type dopant material to form the charge collection well region 170 beneath the p type collection well region 175. The opening 215 permits the implantation of ions 220C of an n type dopant material to form the charge collection well region 170. An example of the n type dopant material is phosphorous, arsenic or antimony. Phosphorous can be ion implanted at a concentration sufficient to form the n type collection well region 170. For example, phosphorous can be ion implanted at a substantially vertical angle in relation to the surface of the substrate 15 at conditions of a dose from about $2\times10^{12}$ atoms per cm$^2$ to about $2\times10^{13}$ atoms per cm$^2$ and an ion implant energy from about 100 keV to about 1000 keV resulting in a phosphorous concentration in a silicon substrate of about $5\times10^{16}$ atoms per cm$^3$ to about $5\times10^{17}$ atoms per cm$^3$.

Figure 3C:
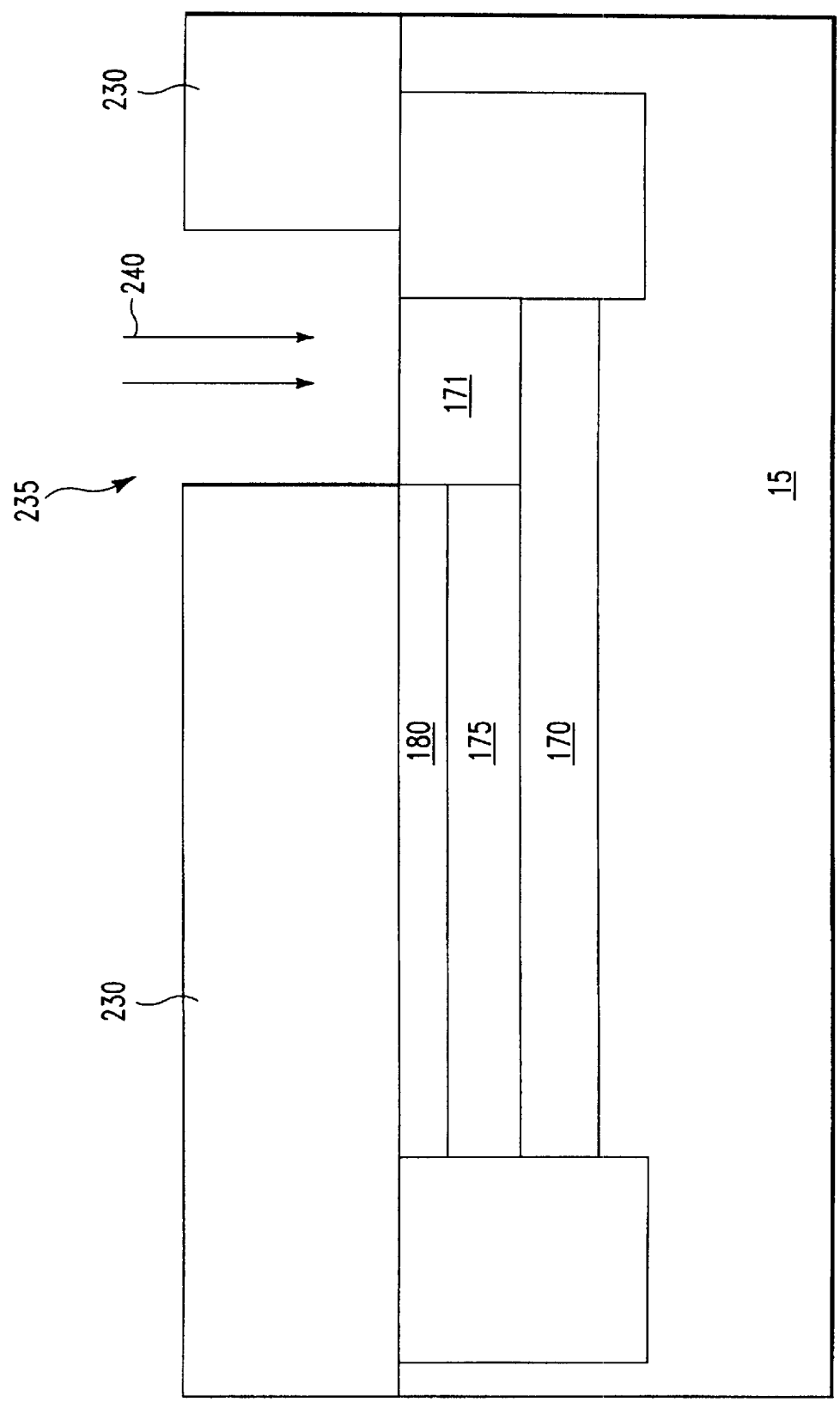

Ion implantation mask 210 is removed and ion implantation mask 230 is formed on substrate 15 to provide an opening 235 as shown in FIG. 3C. The opening 235 permits the implantation of ions 240 of an n type dopant material to form the contact region 171 extending through the pinning layer 180/p collection well region 175 and contacting the n collection well region 170. An example of the n type dopant material is phosphorous, arsenic or antimony. Phosphorous can be ion implanted at a concentration sufficient to form the n type contact region 171. For example, phosphorous can be ion implanted at a substantially vertical angle in relation to the surface of the substrate 15 at conditions of a dose from about $2\times10^{14}$ atoms per cm$^2$ to about $3\times10^{15}$ atoms per cm$^2$ and an ion implant energy from about 100 keV to about 300 keV resulting in a phosphorous concentration in a silicon substrate of about $5\times10^{18}$ atoms per cm$^3$ to about $5\times10^{19}$ atoms per cm$^3$.

Figure 3D:
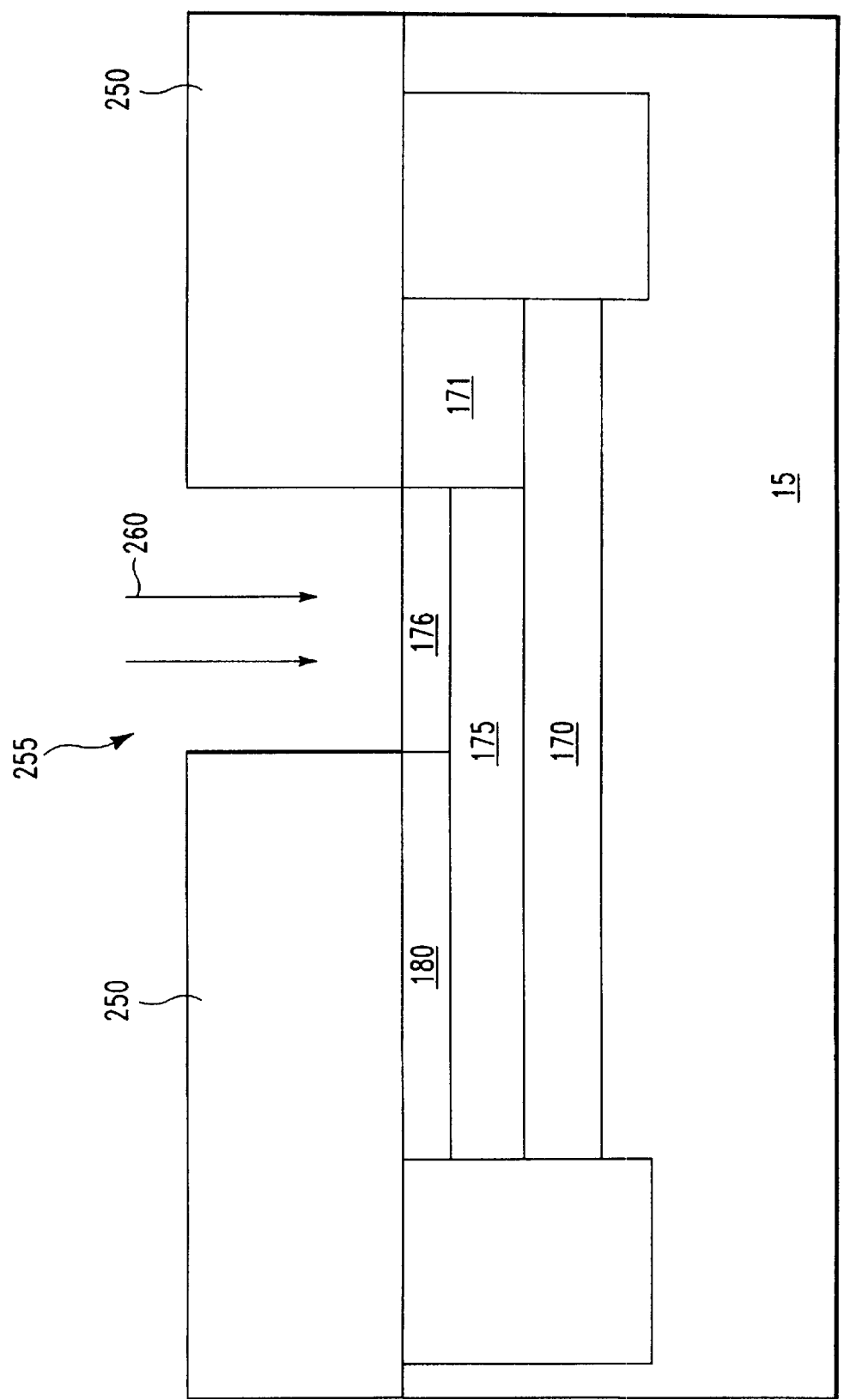

Ion implantation mask 230 is removed and ion implantation mask 250 is formed on substrate 15 to provide an opening 255 as shown in FIG. 3D. The opening 255 permits the implantation of ions 260 of a p type dopant material to form the contact region 176 extending through the pinning layer 180 and contacting the p collection well region 175. An example of the p-type dopant material is boron. Boron can be ion implanted at a concentration sufficient to form the p type contact region 176. For example, boron can be ion implanted at a substantially vertical angle in relation to the surface of the substrate 15 at conditions of a dose from about $2\times10^{14}$ atoms per cm$^2$ to about $3\times10^{15}$ atoms per cm$^2$ and an ion implant energy from about 10 keV to about 50 keV resulting in a boron concentration in a silicon substrate of about $5\times10^{18}$ atoms per cm$^3$ to about $5\times10^{19}$ atoms per cm$^3$.

It is noted that the steps described herein above with reference to FIGS. 3A-3D can be performed in a different order. That is, for example, the pinning layer 180 can be formed after the collection well regions 170, 175 are formed. Likewise, contact region 176 can be formed before contact region 171.

Fabrication of devices, contacts and interconnects associated with circuit structure 195 which are shown schematically in FIG. 2 can be achieved using conventional methods and, as such, fabrication details are omitted for the sake of clarity in order to maintain the focus of the description on the present invention. An advantage of the present invention is that the circuit structure 195 can be located away from the photodiode 200 so that the collection area available for receiving impinging electromagnetic radiation 35 can be increased. Contact regions 171, 176 allow the electron and hole current flows to be routed to the circuit structure 195 without the formation of active devices such as transistors in the vicinity of the collection area of the photodiode 200 as described in commonly assigned U.S. Pat. No. 6,194,702 to Hook et al. Hook requires two transistors to be formed in the collection area in order to provide the electron and hole current flows. In addition to the added complexity to form the transistors, Hook exposes the upper substrate surface of the photodiode to fabrication steps such as film deposition/etching which increases defects at the substrate surface of the photodiode which can have adverse effects on the pixel sensor cell such as an increase in dark current.

Figure 4:
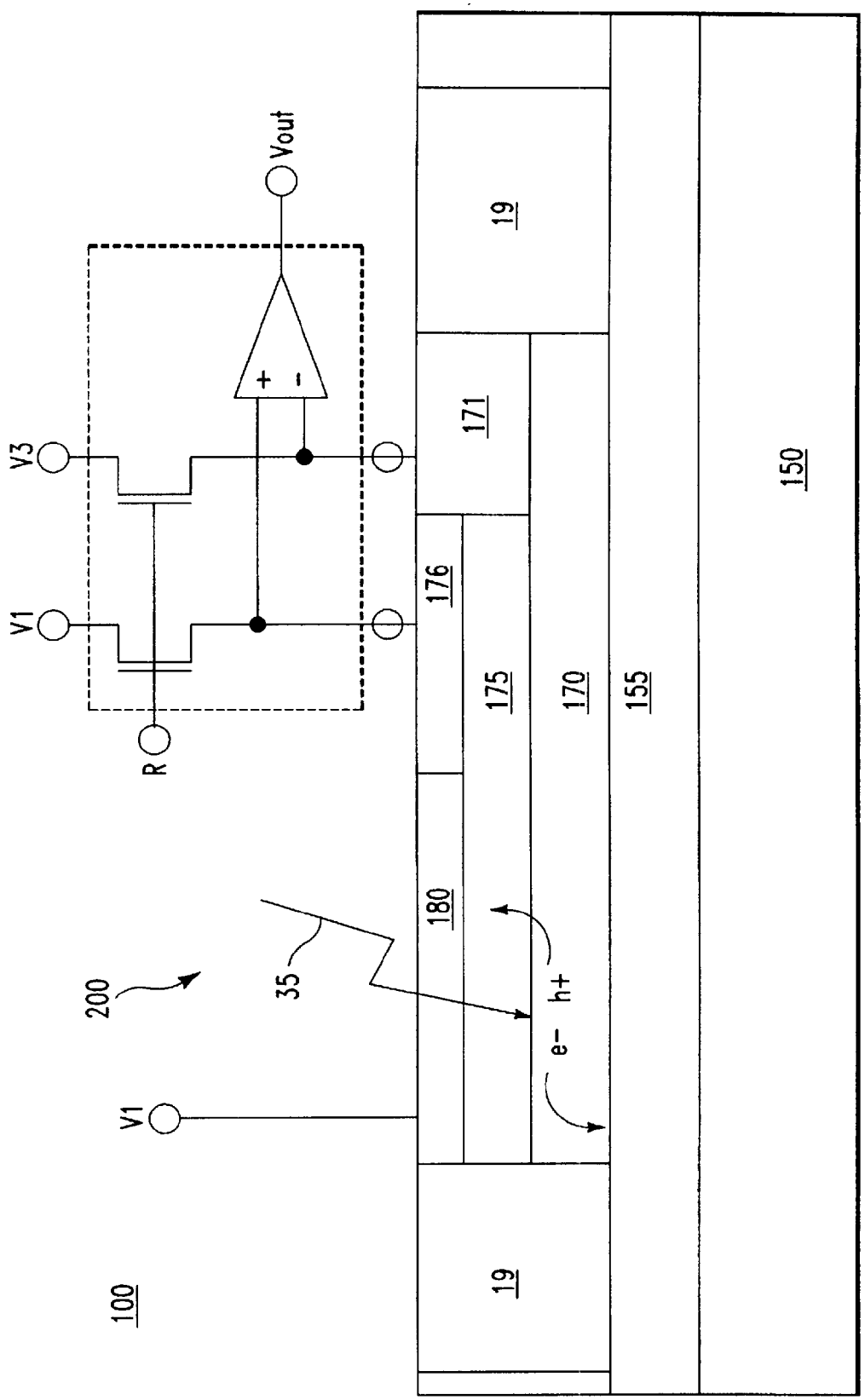
FIGS. 4-6 are cross-sectional views of various other embodiments of the pixel sensor cell according to the present invention.

FIG. 4 illustrates a schematic cross-section of another embodiment of the pixel sensor cell 100 of the present invention. The pixel sensor cell 100 shown in FIG. 2 is formed on a layered substrate 150 such as silicon-on-insulator (SOI), silicon carbide-on-insulator (SiCOI) or silicon germanium-on-insulator (SGOI). For purposes of description of this embodiment of the invention, substrate 150 is a Si-containing semiconductor substrate of a first conductivity type having a buried insulator layer 155 such as, for example, silicon oxide formed by a SIMOX (Separation by Implantation of Oxygen) process or other conventional method. The pixel sensor cell 100 shown in FIG. 4 can be fabricated using the processing steps as described herein above with reference to FIGS. 3A-D to form the photodiode 200 in a layer of substrate 150 over the buried oxide layer 155. An advantage of the pixel sensor cell 100 shown in FIG. 4 is that each cell is electrically isolated from adjacent pixel sensor cells so carriers that are generated in the substrate from one pixel sensor cell cannot be collected by another pixel sensor cell. This, "cross-talk" between pixel sensor cells formed on an SOI substrate is reduced compared to pixel sensor cells formed on a bulk substrate.

Figure 5:
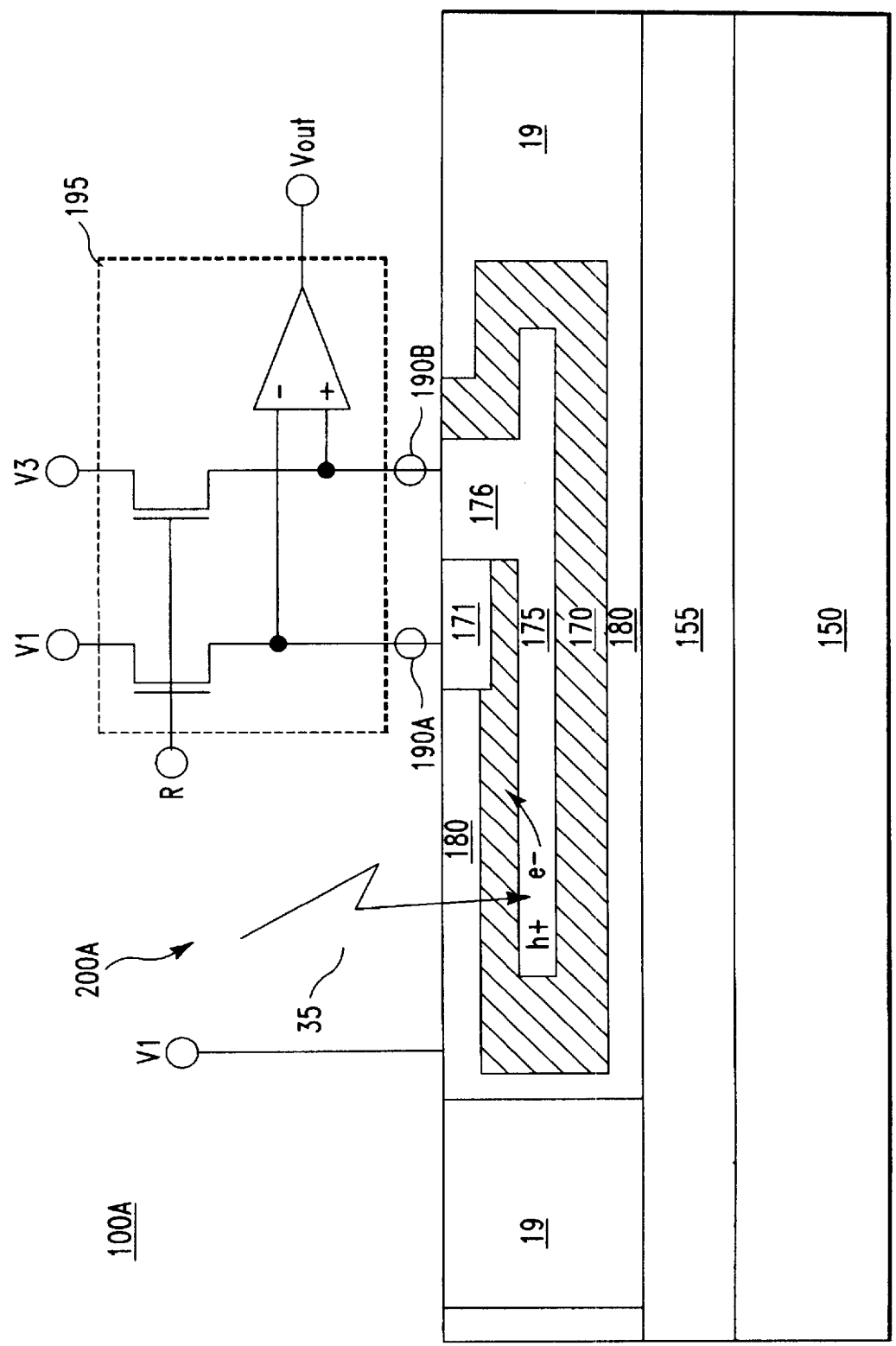

FIG. 5 illustrates a schematic cross-section of another embodiment of a pixel sensor cell 100A of the present invention. As shown in FIG. 5, a photodiode 200A is formed in a layer of substrate 150 over the buried oxide layer 155. The photodiode 200A comprises a pinning layer 180 doped with material, e.g., p type material dopant, which substantially surrounds an n type charge collection well region 170 and a p type charge collection well region 175. The pinning layer 180 is schematically shown electrically coupled to voltage source V1, e.g. ground for p type pinning layer 180 (Vdd for an n type pinning layer 180). The pinning layer 180 can be contacted by, for example, an interconnect (i.e. wire) which provides an electrical path to the voltage source V1. An n type contact region 171 and an interconnect (shown schematically) electrically connect the n collection well region 170 to an input 190A of circuit structure 195. A p type contact region 176 and an interconnect (shown schematically) electrically connect the p collection well region 175 to an input 190B of circuit structure 195. The pinning layer 180 as shown in FIG. 5 may result in a further reduction in dark current for the pixel sensor cell 100A compared to the pixel sensor cell 100 shown in FIG. 2 and conventional pixel sensor cells since the pinning layer 180 provides additional passivation along sidewalls of the isolation regions 19. The pixel sensor cell 100A can be fabricated using conventional methods (not shown) such as, for example, photolithography and ion implantation to form the various dopant regions of the photodiode 200A.

Figure 6:
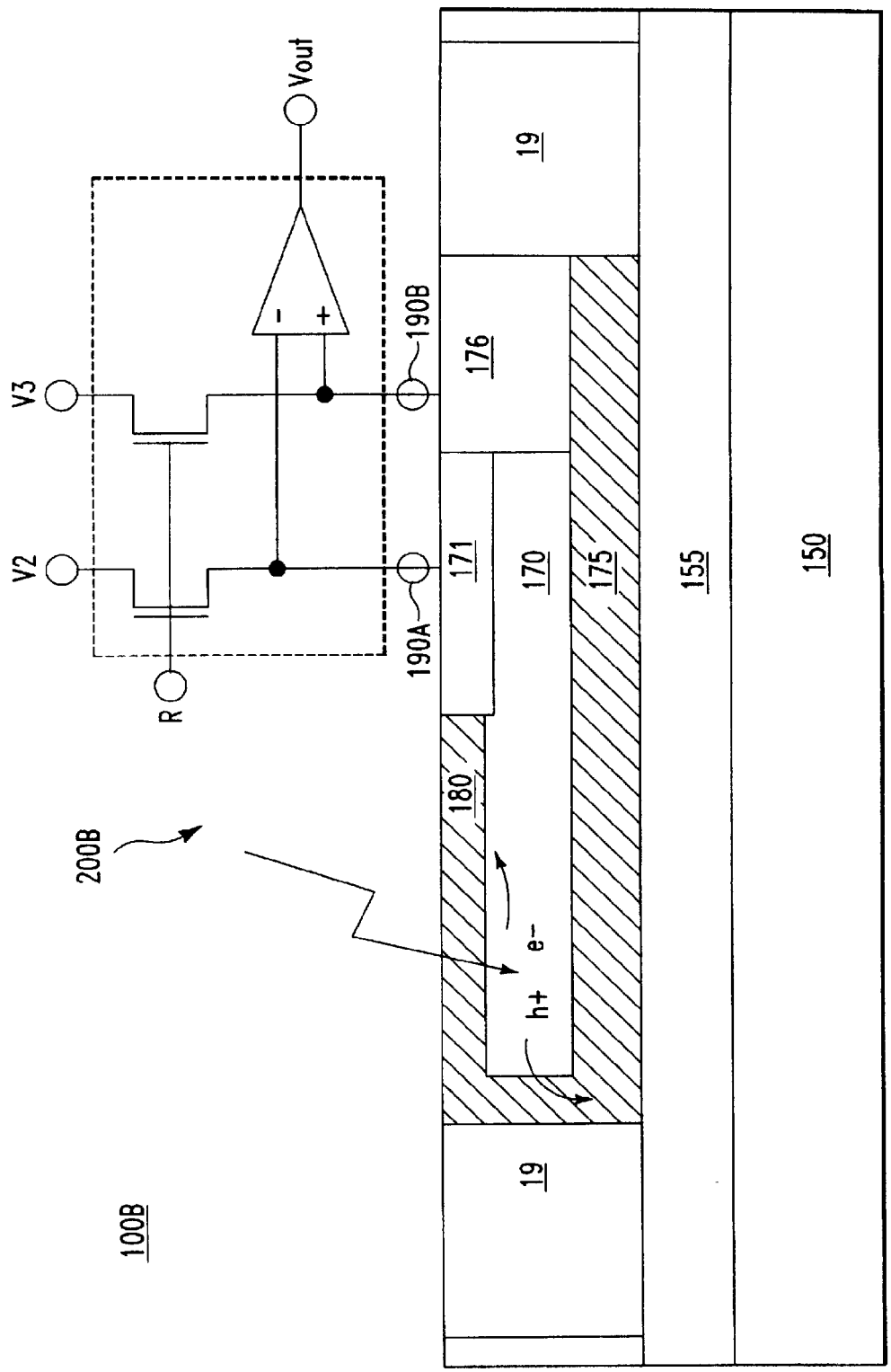

FIG. 6 illustrates a schematic cross-section of yet another embodiment of a pixel sensor cell 100B of the present invention. As shown in FIG. 6, a photodiode 200B is formed in a layer of the substrate 150 over the buried oxide layer 155. The photodiode 200B comprises a collection well region 175 doped with material, e.g., p type material dopant, which substantially surrounds an n type charge collection well region 170. An n type contact region 171 and an interconnect (shown schematically) electrically connect the n collection well region 170 to an input 190A of circuit structure 195. A p type contact region 176 and an interconnect (shown schematically) electrically connect the p type collection well region 175 to an input 190B of circuit structure 195. As was described with reference to FIG. 2, the n type charge collection well region 170 collects electrons and the p collection well region 175 collects holes. The pixel sensor cell 100B can be fabricated using conventional methods (not shown) such as, for example, photolithography and ion implantation to form the various dopant regions of the photodiode 200B.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of forming a pixel sensor cell comprising:
   providing a substrate;
   forming an n-type collection well region in said substrate for collecting electrons generated by electromagnetic radiation impinging on said pixel sensor cell;
   forming an n-type diffusion region in direct physical contact with said n-type collection well region;
   forming a p-type collection well region in said substrate for collecting holes generated by said impinging electromagnetic radiation;
   forming a p-type diffusion region in direct physical contact with said p-type collection well region; and
   forming a circuit structure having a first input coupled to said n-type collection well region and a second input coupled to said p-type collection well region, wherein an output signal of said pixel sensor cell being the magnitude of the difference of a signal of said first input and a signal of said second input.

2. The method of claim 1, wherein said steps of forming said n-type and p-type collection well regions comprise:
   forming a mask structure on said substrate having an opening;
   ion implanting an n-type dopant in said substrate exposed by said opening to form said n-type collection well region; and
   ion implanting a p-type dopant in said substrate exposed by said opening to form said p-type collection well region.

3. The method of claim 2, wherein said step of ion implanting said n-type dopant comprises ion implanting phosphorous ions at a substantially vertical angle in relation to the surface of said substrate at a dose from about $2\times10^{12}$ atoms per cm$^2$ to about $2\times10^{13}$ atoms per cm$^2$ and an ion implant energy from about 100 keV to about 1000 keV.

4. The method of claim 2, wherein said step of ion implanting said p-type dopant comprises ion implanting boron ions at a substantially vertical angle in relation to the surface of said substrate at a dose from about $2\times10^{12}$ atoms per cm$^2$ to about $2\times10^{13}$ atoms per cm$^2$ and an ion implant energy from about 50 keV to about 150 keV.

5. The method of claim 1, wherein said steps of forming said n-type and p-type diffusion regions comprise:
   forming a mask structure having an opening on said substrate;
   ion implanting an n-type dopant in said substrate exposed by said opening to form said n-type diffusion region; and
   ion implanting a p-type dopant in said substrate exposed by said opening to form said p-type diffusion region.

6. The method of claim 5, wherein said step of ion implanting said n-type dopant comprises ion implanting phosphorous ions at a substantially vertical angle in relation to the surface of said substrate at a dose from about $2\times10^{12}$ atoms per cm$^2$ to about $2\times10^{13}$ atoms per cm$^2$ and an ion implant energy from about 100 keV to about 1000 keV.

7. The method of claim 5, wherein said step of ion implanting said p-type dopant comprises ion implanting boron ions at a substantially vertical angle in relation to the surface of said substrate at a dose from about $2\times10^{12}$ atoms per cm$^2$ to about $2\times10^{13}$ atoms per cm$^2$ and an ion implant energy from about 50 keV to about 150 keV.

8. The method of claim 1 further comprising:
   forming a first interconnect for coupling said n-type diffusion region to said first input of said circuit structure; and
   forming a second interconnect for coupling said p-type diffusion region to said second input of said circuit structure.

9. The method of claim 1, wherein said step of forming said circuit structure comprises forming a differential amplifier circuit having a negative input terminal coupled to said first input of said circuit structure and a positive input terminal coupled to said second input of said circuit structure.

10. The method of claim 1 further comprising forming a pinning layer in an upper surface of said substrate.

11. The method of claim 1, wherein said substrate comprises a buried dielectric layer, said n-type and p-type collection well regions formed in a portion of said substrate over said buried dielectric layer.

12. The method of claim 1 further comprising a step of forming a pinning layer substantially surrounding said n-type and p-type collection well regions.

13. The method of claim 1, wherein one of said n-type and p-type collection well regions is formed substantially suffounding the other n-type or p-type collection well regions.

* * * * *